United States Patent [19]

Miller

[11] Patent Number: 6,090,637
[45] Date of Patent: Jul. 18, 2000

[54] FABRICATION OF II-VI SEMICONDUCTOR DEVICE WITH BETE BUFFER LAYER

[75] Inventor: Thomas J. Miller, Minneapolis, Minn.

[73] Assignee: 3M Innovative Properties Company, St. Paul, Minn.

[21] Appl. No.: 08/990,644

[22] Filed: Dec. 15, 1997

Related U.S. Application Data

[60] Provisional application No. 60/037,993, Feb. 13, 1997.

[51] Int. Cl.$^7$ ............................................. H01L 33/00
[52] U.S. Cl. .................................... 438/47; 438/503
[58] Field of Search ................. 438/22, 29, 46, 438/47, 503

[56] References Cited

U.S. PATENT DOCUMENTS

| | | | |
|---|---|---|---|
| 5,213,998 | 5/1993 | Qiu et al. | 437/185 |
| 5,248,631 | 9/1993 | Park et al. | 437/105 |
| 5,274,269 | 12/1993 | DePuydt et al. | 257/744 |
| 5,291,507 | 3/1994 | Haase et al. | 372/44 |
| 5,319,219 | 6/1994 | Cheng et al. | 257/14 |
| 5,363,395 | 11/1994 | Gaines et al. | 372/45 |
| 5,395,791 | 3/1995 | Cheng et al. | 437/105 |
| 5,396,103 | 3/1995 | Qiu et al. | 257/744 |
| 5,404,027 | 4/1995 | Haase et al. | 257/13 |
| 5,420,446 | 5/1995 | Narui et al. | 257/103 |
| 5,423,943 | 6/1995 | Narui et al. | 156/643.1 |
| 5,513,199 | 4/1996 | Hasse et al. | 372/44 |
| 5,515,393 | 5/1996 | Okuyama et al. | 372/45 |
| 5,538,918 | 7/1996 | Haase et al. | 437/127 |

FOREIGN PATENT DOCUMENTS

| | | |
|---|---|---|
| 195 42 241 A1 | 5/1997 | Germany . |
| 8-148765 | 10/1996 | Japan . |
| WO 97/18592 | 5/1997 | WIPO . |

OTHER PUBLICATIONS

Webster's II New College Dictionary, Houghton Mifflin, pp. 44 and 726 (no month given), 1995.

Litz T. et al., "Molecular beam epitaxy of Be–related II–VI compounds", Materials Science and Engineering B, vol. 43, No. 1–3, pp. 83–87, Jan. 1997.

Chow, P.P., "Molecular beam epitaxy," in Thin Film Processes II, edited by J.L. Vossen and W. Kern, Academic Press, p. 134 (no month given), 1991.

Ankudinov A V et al, "Observation of the ZnSe/GaAs Heterojunctions with the BeTe Buffer by Cross–Sectional STM", Compound Semiconductors 1996, Proceedings of the Twenty–Third International Symposium on Compound Semiconductors, St. Petersburg, Russia, Sep. 23–27, 1996, p. 889–892, XP002067765.

Litz T et al, "Molecular beam epitaxy of Be–related II–VI compounds", Materials Science and Engineering B, vol. 43, No. 1–3, Jan. 197, p. 83–87, XP004073400.

Waag A et al, "Beryllium Chalcogenides for ZnSe–based light emitting devices", Materials Science and Engineering B, vol. B43, No. 1/ 03, Jan. 1997, p. 65–70, XP000722613.

*Primary Examiner*—Charles Bowers
*Assistant Examiner*—Keith Christianson
*Attorney, Agent, or Firm*—Judson K. Champlin; Charles L. Dennis, II

[57] ABSTRACT

A II–VI semiconductor device includes a stack of II–VI semiconductor layers electrically connected to a top electrical contact. A GaAs substrate is provided which supports the stack of II–VI semiconductor layers and is positioned opposite to the top electrical contacts. A BeTe buffer layer is provided between the GaAs substrate and the stack of II–VI semiconductor layers. The BeTe buffer layer reduces stacking fault defects at the interface between the GaAs substrate and the stack of II–VI semiconductor layers.

7 Claims, 3 Drawing Sheets

FABRICATION OF II–VI SEMICONDUCTOR DEVICE WITH BETE BUFFER LAYER

The present invention claims priority to Provisional Application Ser. No. 60/037,993, filed Feb. 13, 1997 and entitled LOW-DEFECT BETE BUFFER LAYER.

GOVERNMENT RIGHTS

The United States government has certain rights in this invention pursuant to Contract No. ARPA/ARO DAAH04-94-C0049.

BACKGROUND OF THE INVENTION

The present invention relates to II–VI semiconductor devices such as light emitting diodes and laser diodes. More specifically, the present invention relates to a II–VI semiconductor device having reduced stacking fault defects.

Group II–VI compound semiconductor devices are known. Such devices are useful in constructing light emitting or detecting devices, diodes and laser diodes such as those described in U.S. Pat. No. 5,213,998, issued May 25, 1993; U.S. Pat. No. 5,248,631, issued Sep. 28, 1993; U.S. Pat. No. 5,274,269, issued Dec. 28, 1993; U.S. Pat. No. 5,291,507, issued Mar. 1, 1994; U.S. Pat. No. 5,319,219, issued Jun. 7, 1994; U.S. Pat. No. 5,395,791, issued Mar. 7, 1995; U.S. Pat. No. 5,396, 103, issued Mar. 7, 1995; U.S. Pat. No. 5,404,027, issued Apr. 4, 1995; U.S. Pat. No. 5,363,395, issued Nov. 8, 1994; U.S. Pat. No. 5,515,393, issued May 7, 1996; U.S. Pat. No. 5,420,446, issued May 30, 1995; U.S. Pat. No. 5,423,943, issued Jun. 13, 1995; U.S. Pat. No. 5,538,918, issued Jul. 23, 1996; and U.S. 5,513,199, issued Apr. 30, 1996.

Historically, diodes have generated red or infrared light. However, there are many applications where diodes that emit radiation in shorter wavelengths, for example, in the blue and green portions of the spectrum (i.e., at wavelengths between 590 nm and 430 nm) would be useful. Further, such short wavelength laser diodes would increase the performance and capabilities of many existing systems that currently use infrared and red laser diodes.

Currently, II–VI (ZnSe-based) laser diodes and light emitting diodes grown on GaAs wafers suffer from stacking fault defects that originate at the interface between the III–V material and the II–VI material. These defects extend up through the laser stack and intersect the active (light-generating) region. This intersection is a site for the generation of mobile point defects in the material. These defects appear as a dark spot at the start of laser operation. As laser operation continues, the dark spot grows into a dark line which, in turn, causes more dark lines to form until the device ultimately fails. Because ZnSe has a low stacking fault energy, this type of defect is difficult to avoid.

SUMMARY OF THE INVENTION

The present invention includes a II–VI semiconductor device having a stack of II–VI semiconductor layers. The stack of II–VI semiconductor layers is carried on a GaAs substrate. A BeTe buffer layer is provided between the GaAs substrate and stack of II–VI semiconductor layers. The BeTe buffer layer has a thickness of more than about 80 Å to thereby reduce stacking fault defects at the interface between the GaAs substrate and the stack of II–VI semiconductor layers.

Another aspect of the present invention includes fabricating a II–VI semiconductor device having a BeTe buffer layer positioned between the stack of II–VI semiconductor layers and the GaAs substrate. During fabrication, the BeTe buffer layer is grown to a thickness of more than about 80 Å at a temperature which is sufficiently high to ensure low defect growth initiation.

DETAILED DESCRIPTION OF THE PREFERRED EMBODIMENTS

Figure 1:
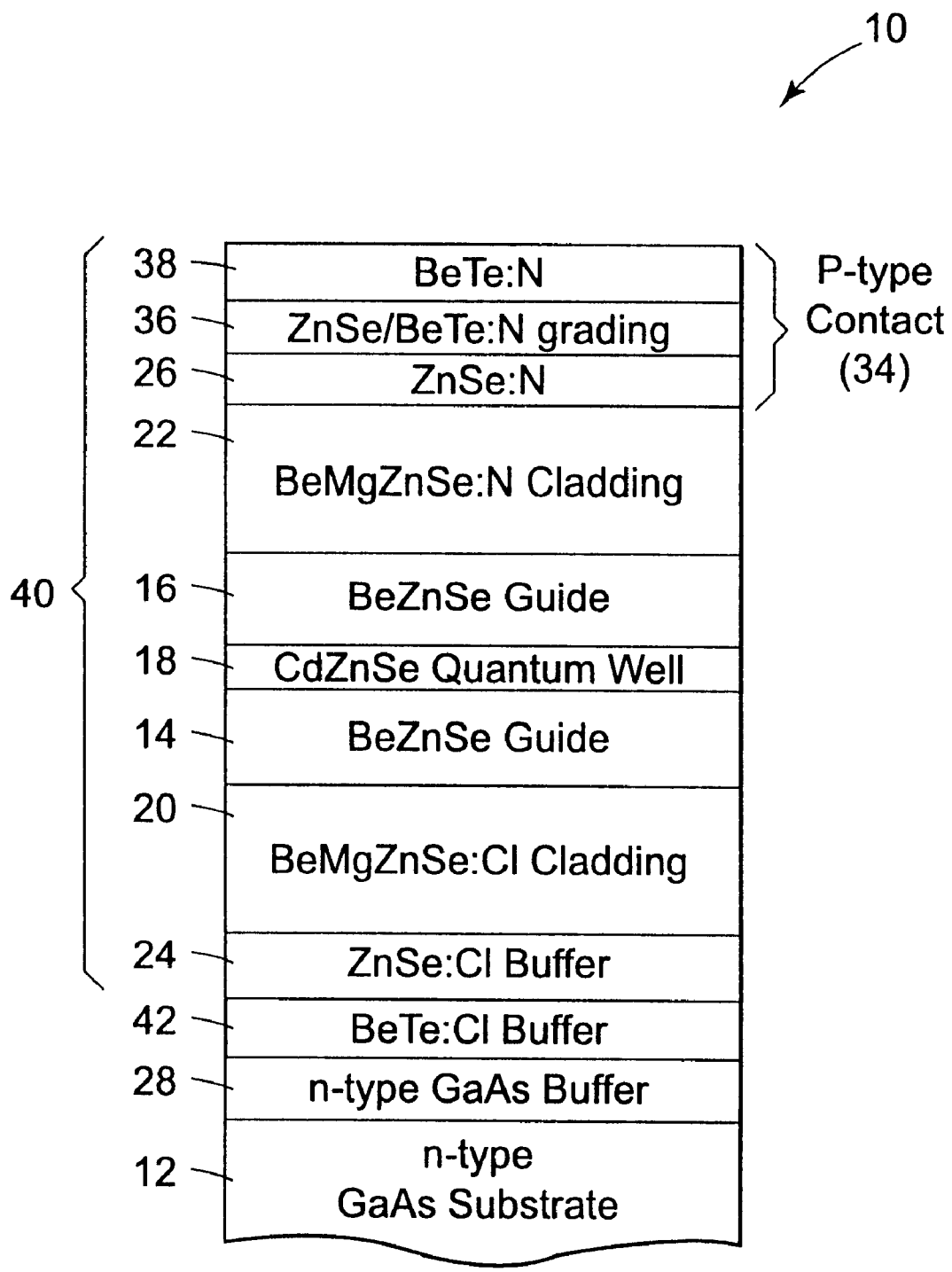
FIG. 1 is a simplified block diagram showing layers of a II–VI semiconductor laser diode in accordance with the present invention.

The structure of a laser diode 10 in accordance with the present invention is illustrated generally in FIG. 1. Laser diode 10 is a wide bandgap II–VI device fabricated from heteroepitaxial layers grown by molecular beam epitaxy (MBE) on a GaAs substrate. Laser diode 10 is fabricated on a GaAs substrate 12 and includes lower (first) and upper (second) BeZnSe light guiding layers 14 and 16, respectively, separated by a CdZnSe quantum well active layer 18. The surface of light guiding layers 14 and 16 opposite active layer 18 are bounded by lower (first) BeMgZnSe:Cl and upper (second) BeMgZnSe:N cladding layers 20 and 22 respectively. A lower ZnSe:Cl buffer layer 24 is positioned on the surface of lower cladding layer 20 which is opposite light guiding layer 14. An upper BeTe:N/ZnSe p-type ohmic contact 34 is positioned on the surface of upper cladding layer 22 which is opposite light guiding layer 16.

An n-type GaAs buffer layer 28 separates substrate 12 from lower ZnSe:Cl buffer layer 24 to assure high crystalline quality of the subsequently grown layers. P-type ohmic contact 34 is formed by ZnSe:N layer 26, ZnSe/BeTe:N grading layer 36, and BeTe:N layer 38 and may include a ZnTe:N capping layer (not shown). Electrodes (not shown) are provided for electrical contact laser diode 10. Layers 20 and 24 are all doped n-type with Cl (i.e., are of a first conductivity type). Further, layers 22 and 26 are doped p-type with N (i.e., are of a second conductivity type). Active layer 18 is an undoped quantum well layer of CdZnSe or alternatively, CdZnSSe semiconductor. Layers 12 through 26 and 34 provide one example of a "stack of semiconductor layers" 40 in accordance with the present invention.

In FIG. 1 a BeTe buffer layer 42 is shown in accordance with the present invention. BeTe buffer layer is positioned generally in a region near the interface between GaAs substrate 12 and the stack of II–VI semiconductor layers 40 to thereby reduce stacking fault defects in laser diode 10. In one preferred embodiment, BeTe buffer layer 42 has a thickness of more than about 80 Å. Because BeTe has a much lower ionicity, it has been proposed that it also has a higher stacking fault energy. However, prior art attempts at growing BeTe at about 300° C., the temperature at which other II–VI layers are grown, resulted in high defect densities. Therefore the substrate temperature during the BeTe growth initiation should be greater than 300° C.

In one experiment, GaAs buffer layers were grown on GaAs substrates in a first MBE chamber, according to known techniques. After growth of buffer layer 28, the substrate temperature was lowered to 300° C. Either a(2×4) As surface, or a c(4×4) (excess As) surface was prepared in the first chamber, as evidenced by reflection high-energy electron diffraction (RHEED).

The substrate with the buffer layer 28 was then transferred to a second MBE chamber equipped with at least Be, Te, Zn, and Se sources. The substrate temperature was then increased over about 5 minutes to a temperature of approximately 520° C. at which time the excess As of a c(4×4) surface starts to desorb, leaving a (2×4) surface reconstruction. If a (2×4) surface was prepared in the first MBE chamber, no change in RHEED pattern was observed. While the substrate temperature was still increasing, and when the quality of the (2×4) RHEED pattern was at its best (especially in the case of c(4×4) transfer), the BeTe growth was commenced.

The BeTe was grown at a temperature in the range of between about 580° C. and about 680° C., and at a rate of about 0.25 μm/hr to various thicknesses. For the samples having 500 Å of BeTe, the substrate temperature was decreased after depositing the first quarter to half of the BeTe growth so that the growth of ZnSe could commence without interruption at a substrate temperature of less than 330° C. For all others, the temperature was held constant until the end of the BeTe growth, at which time the substrate was cooled to less than 330° C. for the ZnSe growth. For all growths, the BeTe surface exhibited a (2×1) pattern during growth, indicative of an excess Te flux.

Figure 2:
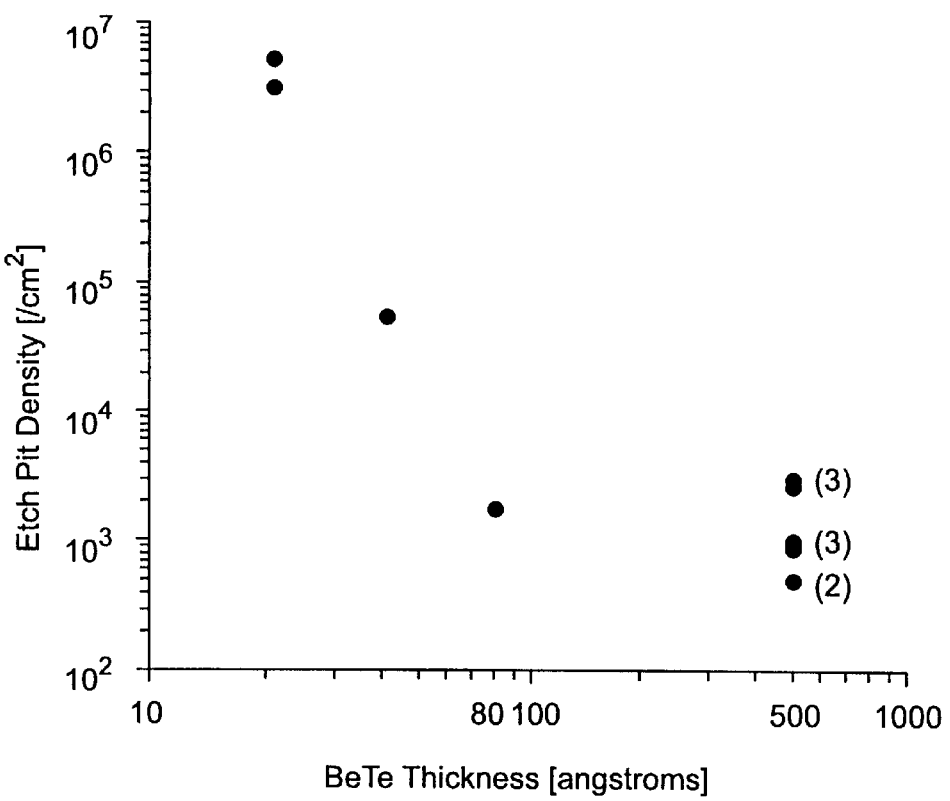
FIG. 2 is a plot of defect density versus thickness of a BeTe layer.

Several samples were grown with various BeTe thicknesses in the range of 20 to 500 Å. (It has previously been determined that the critical thickness of BeTe on GaAs is about 1000 Å.) FIG. 2 is a plot of defect density versus BeTe thickness. This plot suggests that there is some minimum thickness of BeTe required to achieve a low defect density in subsequent II–VI growth.

In addition, several samples were grown by a method which only varied in the species and duration of the initial flux (Be or Te) prior to the growth of the 500 Å BeTe immediately after. Samples which were exposed to a Te flux for 10 s, or as little as one second (equivalent of sub-monolayer Te-coverage), prior to the growth of the BeTe buffer layer at 600° C. had defect densities as high as $10^7/cm^2$. Samples which were pre-exposed to a Be flux for up to 3 s (equivalent of up to one monolayer Be-coverage) prior to the BeTe growth had defect densities of $10^3/cm^2$ or less, while samples having a Be pre-exposure of 10 s had defect densities as high as $10^7/cm^2$.

In the case of the Te pre-exposure, the high defect densities may be attributed to the formation of $Ga_2Te_3$, which could form a stacking fault, much like $Ga_2Se_3$ in the case of ZnSe growth on GaAs. In the case of Be pre-exposure, the surface is tolerant of up to but not more than, a single monolayer of Be. Because Be has a low vapor pressure, it is speculated that Be clusters may form on the GaAs surface if more than a monolayer is deposited resulting in a high defect density. Be pre-exposure of a single monolayer or less may be advantageous in that it protects the GaAs surface from Te.

As mentioned above, the 500 Å BeTe samples differed slightly in the amount of time that the substrate temperature was held high. This time corresponds to 100 Å to 200 Å of BeTe growth. Decreasing the temperature too soon may have an effect equivalent to not growing enough BeTe initially.

One aspect of the invention is a BeTe buffer layer grown on GaAs, having a thickness which is greater than a minimum value of about 80 Å and less than a maximum value of about 1000 Å. Included in the invention is a high substrate temperature for BeTe growth, and the preparation of the (2×4) GaAs surface prior to BeTe growth.

Figure 3:
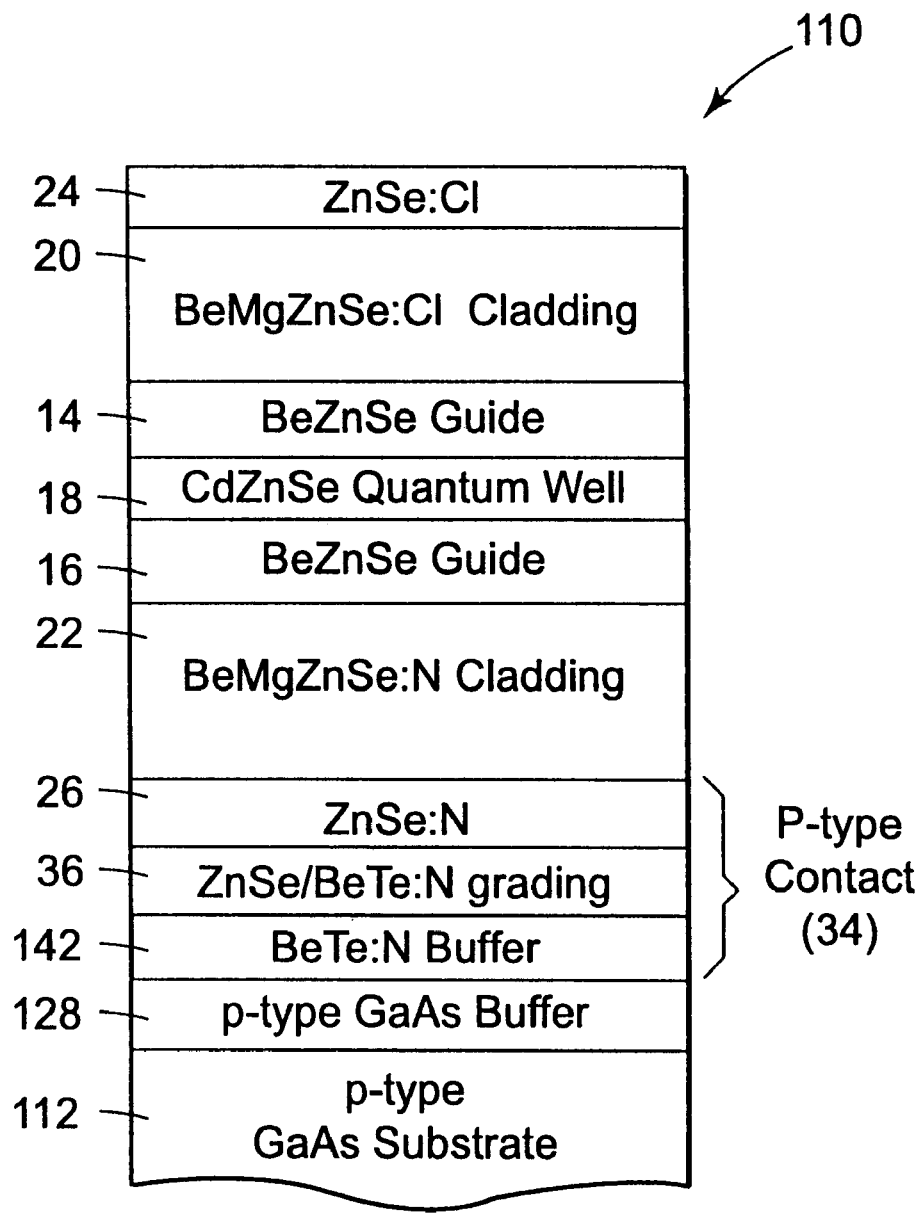
FIG. 3 is a simplified block diagram showing layers of a II–VI semiconductor laser diode in accordance with another embodiment of the present invention formed on a p-type GaAs substrate.

Low-defect BeTe buffers grown by the method outlined above have been utilized to grow low-defect blue-green laser diodes such as diode 10 shown in FIG. 1. For simplicity, similar semiconductor layers in FIG. 3 have retained their numbering from FIG. 1. In the embodiment of FIG. 3, p-type contact 34 is formed adjacent p-type GaAs substrate 112 upon p-type GaAs buffer layer 128. In the embodiment of FIG. 3, p-type contact 34 includes BeTe:N buffer layer 142 in accordance with the present invention which is deposited upon p-type GaAs buffer 128. BeTe buffer layer 142 is grown as described above and to the same thickness range to thereby reduce defects. Note that for n-substrate laser structures (FIG. 1), it is desirable to keep the BeTe thickness to a minimum since the conduction band offset between GaAs and BeTe is large (~1 eV). With n-type substrates, the BeTe layer is only used to achieve a low defect density and it has a negative effect on electron transport. However, for p-type GaAs substrates (FIG. 3) a thicker BeTe buffer is acceptable because the valence band offset between GaAs and BeTe is small. This allows the BeTe to also assist in hole injection. In either case, the BeTe thickness should fall in the range noted above to ensure a low defect density. In one test using an 80 Å BeTe buffer grown by this technique, two n-type—substrate lasers were grown which had defect densities of about $3000/cm^2$. Also, single layers of ZnSe have been grown on these BeTe buffers resulting in defect densities in the ZnSe of less than $1000/cm^2$, and in some cases less than $500/cm^2$.

Although the present invention has been described with reference to preferred embodiments, workers skilled in the art will recognize that changes may be made in form and detail without departing from the spirit and scope of the invention. As used herein, "stack of II–VI semiconductor layers" includes any layer or grouping of layers including light producing devices, the laser diodes set forth herein or other configurations such as diodes, devices with n-type up, etc. Semiconductor devices of the invention are useful as lasers, light emitting diodes, sensors, etc. Lasers are useful in electronic systems, electronic displays, optical data storage systems, optical communication systems, etc.

What is claimed is:

1. A method of fabricating a II–VI semiconductor device, comprising the steps of:

placing a GaAs substrate into a molecular beam epitaxy chamber;

growing a BeTe buffer layer in operational contact with the GaAs substrate to a thickness of more than about 80 Å and less than 1000 Å the BeTe buffer layer configured to reduce stacking faults; and growing subsequent layers upon the BeTe buffer layer to form a stack of II–VI semiconductor layers of a II–VI semiconductor device.

2. The method of claim 1 including maintaining the temperature of the substrate greater than 300° C. during the step of growing the BeTe buffer layer.

3. The method of claim 1 wherein the GaAs substrate is n-type and the step of growing a BeTe buffer layer includes doping the BeTe buffer layer n-type.

4. The method of claim 1 wherein the GaAs substrate is p-type and the step of growing a BeTe buffer layer includes doping the BeTe buffer layer p-type.

5. The method of claim 1 wherein the BeTe buffer layer was grown at a rate of about 0.25 μm/hr.

6. The method of claim 1 including pre-exposing the GaAs substrate to Be prior to the step of growing the BeTe buffer layer.

7. The method of claim 6 wherein the step of providing a Be pre-exposure comprises growing a Be layer of up to about one monolayer.

* * * * *